United States Patent [19]

Murata et al.

[11] Patent Number: 5,798,005
[45] Date of Patent: Aug. 25, 1998

[54] TITANIUM TARGET FOR SPUTTERING AND PRODUCTION METHOD FOR SAME

[75] Inventors: Hideo Murata, Tottori-ken; Shigeru Taniguchi, Yasugi, both of Japan

[73] Assignee: Hitachi Metals, Ltd., Tokyo, Japan

[21] Appl. No.: 623,861

[22] Filed: Mar. 29, 1996

[30] Foreign Application Priority Data

Mar. 31, 1995 [JP] Japan .................. 7-099977

[51] Int. Cl.$^6$ .................. C22C 14/00
[52] U.S. Cl. .................. 148/421; 148/670
[58] Field of Search .................. 148/421, 670; 420/417

[56] References Cited

U.S. PATENT DOCUMENTS

| | | | |
|---|---|---|---|
| 4,678,506 | 7/1987 | Bania | 75/10.25 |
| 4,793,854 | 12/1988 | Shimotori et al. | 75/10.1 |
| 4,891,066 | 1/1990 | Shimotori et al. | 75/84 |
| 5,196,916 | 3/1993 | Ishigami et al. | 420/417 |
| 5,204,057 | 4/1993 | Ishigami et al. | 148/421 |

FOREIGN PATENT DOCUMENTS

| | | | |
|---|---|---|---|
| 0 408 383 A1 | 1/1991 | European Pat. Off. | 420/417 |
| 5-214521 | 8/1993 | Japan . | |
| 6-10107 | 1/1994 | Japan . | |
| 6-280009 | 10/1994 | Japan . | |

*Primary Examiner*—John Sheehan
*Attorney, Agent, or Firm*—Sughrue, Mion, Zinn, Macpeak & Seas, PLLC

[57] ABSTRACT

Provided are a titanium target material which can easily form a film in a narrow and deep contact hole and reduce the generation of PARTICLES. The present invention relates to a titanium target for sputtering, wherein X-ray diffraction intensity ratios on a sputtering plane are $(0002)/(10\bar{1}1) \geq 0.8$, $(0002)/(10\bar{1}0) \geq 6$; a recrystallized structure which has an average crystal grain size of 20 μm or less and in which the proportion of crystal grains in which an acicular structure is present is 20% or less in terms of an area rate is formed.

9 Claims, 5 Drawing Sheets

FIG. 1a

HEATING TEMPERATURE 400°C
(INVENTION SPECIMEN)

HEATING TEMPERATURE 400°C
(INVENTION SPECIMEN)

HEATING TEMPERATURE 470°C
(INVENTION SPECIMEN)

HEATING TEMPERATURE 470°C
(INVENTION SPECIMEN)

HEATING TEMPERATURE 280°C
(COMPARATIVE SPECIMEN)

HEATING TEMPERATURE 280°C
(COMPARATIVE SPECIMEN)

HEATING TEMPERATURE 580°C
(COMPARATIVE SPECIMEN)

HEATING TEMPERATURE 580°C
(COMPARATIVE SPECIMEN)

(X400)   25 μm

FIG. 5a
INGOT

(X100)  100μm

FIG. 5b
INGOT

(X400)  25μm

FIG. 6a
AFTER FORGING (X100)  100μm

FIG. 6b
AFTER FORGING (X400)  25μm

FIG. 7a

ROLLING (X100)  100μm

FIG. 7b

ROLLING (X400)  25μm

Rmax 2.0 μm

Rmax 5.0 μm

TITANIUM TARGET FOR SPUTTERING AND PRODUCTION METHOD FOR SAME

BACKGROUND OF THE INVENTION

The present invention relates to a titanium target for sputtering used for forming a film containing titanium by sputtering, and a production method for the same.

DESCRIPTION OF THE PRIOR ART

In recent years, high integration, high function and high reliability of LSI have required more and more severe accuracy of a fine wiring art. This has tended to small contact holes for carrying out electrical contact of fine wirings and cause P type or N type doping layers formed thereunder to be formed in a shallower and narrower region. When a doping layer of LSI described above is shallow, a direct formation of aluminum and the like used for wiring on a silicon substrate creates the problem that a mutual diffusion reaction takes place and aluminum easily diffuse to pass through the doping layer to damage the contact structure of a semiconductor.

In order to prevent the mutual diffusion reaction, it has been attempted to form a diffusion resistant layer (called a barrier metal layer in some cases) comprising high melting materials such as molybdenum-silicon, tungsten-silicon and tungsten-titanium between a wiring and a silicon substrate.

In recent years, it has been found that a titanium nitride compound layer as the diffusion resistant layer is particularly excellent in a diffusion resistance, and researches for reducing a contact resistance between a titanium nitride compound layer and a substrate are in progress for bringing it into practical use.

For example, as shown in Semiconductor World Monthly 1992.12, PP. 196 to 205 or Semiconductor World Monthly 1989.12, PP. 189 to 192, it was found that it is effective as one means for reducing a contact resistance between a silicon substrate and a titanium nitride compound layer to form a titanium silicide layer having a low contact resistance between the titanium nitride compound layer and the silicon substrate.

In order to form a titanium silicide layer, employed is (1) a method in which as shown in the above publications, after the target of titanium is sputtered to form a pure titanium thin film on a silicon substrate, the surface of the pure titanium thin film is nitrided by subjecting the substrate to a heat treatment in an ammonia gas atmosphere to thereby form a titanium nitride layer and in addition, the pure titanium thin film is reacted with the silicon substrate to form titanium silicide, or (2) a method in which after the target of titanium is sputtered to form a very thin pure titanium film, a heat treatment is provided to turn the titanium film into a titanium silicide film, and then a titanium nitride thin film having a stoichiometric composition is formed on the titanium silicide film with a titanium target by means of reactive sputtering gas prepared by introducing nitrogen gas into sputtering gas.

As described above, a titanium target is used in many cases in a course in which the films of titanium nitride and titanium silicide used for highly integrated LSI are obtained.

The titanium target is used for forming the films of titanium nitride and titanium silicide used for highly integrated LSI by sputtering.

Various improvements have been proposed for a titanium target. For example, as described in JP-B2-4-75301, it is attempted to reduce an oxygen amount to lower the electric resistance of a thin film and to exclude the influence of trace radioactive elements by high purification.

Further, as described in JP-A-5-214521, it is proposed to orient a priority direction to (0002) in order to enhance the forming rate of a titanium film.

Proposed in JP-A-6-10107 or JP-A-6-280009 are methods in which in order to control the generation of PARTICLES from a titanium target and uniformize a film thickness distribution in a titanium film formed by sputtering, cold working and a subsequent heat treatment are controlled to obtain a fine recrystallized structure, whereby foreign matters usually called "PARTICLES" are prevented from sticking.

As high integration of LSI which is a semiconductor integrated circuit advances, contact holes tend to become small in diameter and relatively deep, and it is getting difficult to form evenly a film at the bottom of a contact hole by sputtering.

That is, if in sputtering, all of sputtering grains sputtered from the surface of a target by Ar ions and the like are injected vertically into a substrate on which a film is to be formed, no problems will be produced since the grains can reach the bottom of a contact hole. However, the fact is that some distribution exists in the direction of sputtering grains sputtered from a target by sputtering. This means that sputtering grains are injected obliquely to the contact hole in some cases. If the grains injected obliquely are numerous, more films are formed on the side face of the contact hole not at the contact hole bottom on which the film has to be formed, and therefore the aperture part of the contact hole becomes narrow, which makes it difficult to form evenly the film at the contact hole bottom.

As described in Electronic Journal (October 1994, PP. 32), (1) a method has so far been available to such problem as described above, in which a partition plate called a collimator is interposed between a target and a substrate so that only sputtering grains injected vertically to the substrate are used for forming a film. In this method, however, almost all sputtering grains adhere to this collimator, and the film-forming rate is markedly lowered. Not only the productivity is reduced but also a titanium film adhering to the collimator peels off and adheres to a substrate, which produces a risk to cause electric disconnection and short circuit and lower a production yield. Accordingly, it is not a preferred method. Further, (2) a method is available as well, in which a distance between a target and a substrate is expanded so that only sputtering grains vertical to the substrate out of the grains reaching the substrate can reach the substrate as much as possible. Also in this method, however, not only the film-forming rate is markedly reduced to lower the productivity, but also produced is the problem that a vacuum chamber in which sputtering is carried out is increased in a size, which makes the apparatus itself large-sized and expensive.

As described above, a contact hole tends to become small in diameter and relatively deep, and the generation of foreign matters, that is, the generation of PARTICLES is a serious defect for the contact hole.

It is described in JP-A-6-10107 or JP-A-6-280009 that a structure having fine recrystallized grains described above can be formed in order to reduce the generation of PARTICLES. However, only the formation of a fine recrystallized structure is not still sufficient, and further reduction in PARTICLES is required.

Further, a texture on the (0002) planes is proposed in JP-A-5-214521 in order to enhance a film-forming rate.

However, according to the investigations made by the present inventors, it has become clear that only making the texture on the (0002) planes can not control the generation of PARTICLES described above.

SUMMARY OF THE INVENTION

An object of the present invention is to provide a titanium target material which can align the direction of sputtering grains and readily form a film in contact holes small in diameter and relatively deep, and which can reduce the generation of PARTICLES, and a production method for the same.

The present inventors have intensively investigated the relationship of the structure of titanium to the direction of sputtering grains and the generation of PARTICLES. Titanium has been subjected to cold working at a cold working rate notably higher than conventional ones and to a heat treatment at lower temperatures than conventional heat treatment temperatures to find that crystals on the sputtering plane of a target are oriented more strongly to the (0002) planes than in random orientation and that a recrystallized structure having strong crystal orientation in which (10$\bar{1}$0) and (10$\bar{1}$1) intensities are lowered, and very fine crystal gains can be formed. The cold working rate described in the present invention means a working rate obtained by adding all which carry out cold working.

It has been found that sputtering the titanium target having the structure described above can satisfy two objects of reducing the generation of PARTICLES and aligning the direction of sputtering grains at the same time, and thus the present invention has been completed.

That is, the present invention provides a titanium target in which an X-ray diffraction intensity ratio on a sputtering plane is oriented to (0002)/(10$\bar{1}$1) $\geq$0.8 and (0002)/(10$\bar{1}$0)$\geq$6, and which has a recrystallized structure having an average crystal grain size of 20 μm or less, preferably 10 μm or less.

The titanium target of the present invention can be obtained by the production method of the present invention in which a plate titanium material is subjected to cold working at a working rate of 75% or more and then heated at temperatures of 300° to 480° C. to orient an X-ray diffraction intensity ratio on a sputtering plane to (0002)/(10$\bar{1}$1)$\geq$0.8 and (0002)/(10$\bar{1}$0) $\geq$6, and in which a recrystallized structure having an average crystal grain size of 20 μm or less is obtained. More preferred degree of crystal orientation is to cause crystals to be oriented further strongly to the (0002) planes and weaken relatively an orientation degree in (10$\bar{1}$1) plane to set the X-ray diffraction intensity ratio to (0002)/(10$\bar{1}$1)$\geq$1.0.

The production method for the titanium target of the present invention is characterized by that the cold working reduction ratio is as markedly high as not expected from conventional methods and a temperature for a heat treatment subsequently carried out is as low as unexpected from conventional methods. That is, the upper limit of the conventional cold working rate of a titanium target has been at most 70% or more. This is due to that it has been considered that raising a working rate further more is liable to cause cracking at the end of a material. A working rate in cold working has not been raised to 70% or more because of a large load exerted on apparatuses for rolling and the like.

In contrast with this, the present invention is characterized by that as large cold working reduction ratio as 75% or more is provided. This can be achieved by, for example, setting the working rate to about 15% in causing a titanium material to pass through for rolling once, repeating it several times and arranging the form of the titanium material such as rounding the edge of the material.

Further, in the present invention, an another advantage in obtaining a recrystallized structure at low temperatures is that an acicular structure can be prevented from generating in crystal grains to such a large extent that characteristics as a target are not deteriorated.

The generation of the acicular structure in each crystal grain is caused by trace heated to a "β" titanium region or the generation of "twin". In any cases, it leads to the presence of foreign phases in crystal grains and becomes one of causes for increasing the generation of PARTICLES. Accordingly, it is not preferred.

In the present invention, the rate of crystal grains in each of which an acicular structure is present is reduced preferably to 20% or less in terms of an area ratio.

The acicular structure of titanium having an hcp structure is produced when titanium is heated to high temperatures, for example, 800° C. or higher and cooled after transforming to a β layer, or if a cooling rate is fast, "twin" are formed in crystal grains even at 500° C. or higher to produce the acicular structure.

The present invention makes it possible to control these acicular structures formed in cooling in order to obtain a recrystallized structure at low temperatures.

Less oxygen amount is better in terms of reducing the electric resistance of a titanium thin film formed, and the oxygen concentration is reduced preferably to 600 ppm or less by selecting the material.

The presence of large variance in a crystal grain size makes it difficult to allow erosion in sputtering to proceed uniformly, and therefore a structure in which the size of crystal grains is uniformized as much as possible is preferably formed. In the present invention, a high cold-working reduction allows a lot of strain to be provided, and recrystallization is carried out at low temperatures, whereby a fine recrystallized structure having a uniformized grain size has been formed. The scattering thereof is controlled preferably in a range of 3 to 15 μm.

DETAILED DESCRIPTION OF THE INVENTION

As described above, one of the most important features for the target of the present invention is that crystal orientation on a sputtering plane by X-ray diffraction is orientation to the (0002) planes which are the closest atom-packed plane in closest packed-hexagonal crystal (hcp) rather than random orientation and that crystal orientation satisfying $(0002)/(10\bar{1}1) \geq 0.8$ and $(0002)/(10\bar{1}0) \geq 6$ in terms of an X-ray diffraction intensity ratio has been achieved with a fine grain recrystallized structure.

Titanium is subjected to cold working at a reduction ratio of about 70% or less and then to a heat treatment to cause recrystallization, whereby the orientation of the (0002) planes textured by the cold working is broken to a large extent and close to random orientation. Crystal grains become fine at about 500° C. which is a recrystallization temperature usually used in the cold working of titanium, but a strong (0002) orientation of $(0002)/(10\bar{1}1) \geq 0.8$, $(0002)/(10\bar{1}0) \geq 6$ can not be obtained.

In the present invention, since as high cold working rate as 75% or higher is applied, recrystallization goes on at low temperatures, and a recrystallized structure is formed at low temperatures. Accordingly, the fine recrystallized structure having an average crystal grain size of 20 μm or less can be obtained. That is, the fine recrystallized structure having less fibrous structure can be obtained at 480° C. or lower.

Further, since the cold working rate is high, the orientation of the (0002) planes oriented by cold working can be maintained as well after heat treatment, and therefore a target which has a fine recrystallized structure in combination with the preceding recrystallization at low temperatures and which is oriented to the (0002) planes can be obtained.

In the titanium target of the present invention, an X-ray diffraction intensity orients the (0002) planes which are closest packed plane in a closest hexagonal structure strongly to a sputtering plane to increase an atomic density and reduce $(10\bar{1}1)$, $(10\bar{1}0)$.

It is supposed that since in the closest packed plane, the respective titanium atoms constituting a titanium target are present most densely, they are influenced by adjacent atoms when they are sputtered from a sputtering plane and are hard to fly out to the side.

This enhances the probability that the (0002) planes which are a closest packed plane is present on a sputtering plane and makes it possible to release sputtering grains arranged in a perpendicular direction from the sputtering plane and allow the sputtering grains to reach contact holes perpendicularly to them more than a target having a random crystal orientation does.

With respect to the random crystal orientation, it is reasonable to say that a titanium target in which an ingot is prepared by vacuum melt forging or electron beam melting is oriented at random, and a $(10\bar{1}1)$ diffraction intensity is main in X-ray diffraction. An X-ray diffraction intensity ratio in orienting at random is 0.2 to 0.3 in terms of a ratio $(0002)/(10\bar{1}0)$ and about 1.2 in terms of a ratio $(0002)/(10\bar{1}1)$.

Crystal planes on a sputtering plane are preferably uniform and similar planes. Not only they are oriented merely to the (0002) planes which are the closest atomic planes but also a measure has to be taken so that a crystal plane having a rough atomic arrangement density is not present as much as possible.

In conventional techniques, only orientation to the (0002) planes have been considered at most.

In the present invention, however, experiments have resulted in finding that reducing crystal planes having a rough atomic arrangement density at the same time is markedly effective for aligning a direction to a substrate, and the present invention is characterized by controlling the orientation of a crystal plane in a sputtering plane with the ratio of the closest atomic planes (0002) to rough crystal planes $(10\bar{1}1)$, $(10\bar{1}0)$.

That is, in the present invention, a ratio $(0002)/(10\bar{1}0)$ is set at 6 or more from this point of view in addition to the regulation of $(0002)/(10\bar{1}1) \geq 0.8$. This makes it possible to release grains in which the direction is aligned more to a substrate.

In the present invention, it is very important in terms of controlling the generation of PARTICLES to provide the crystal orientation described above.

Having strong orientation means that a crystal plane on a sputtering plane is aligned, and difference between erosion rates caused by sputtering every crystal grain, which originates in the directionality of crystals, can be reduced.

Accordingly, the target of the present invention controlling all of the planes (0002), a $(10\bar{1}1)$ plane and a $(10\bar{1}0)$ plane to provide a strong orientation is less liable to produce level difference in a crystal grain boundary formed by crystal grains, and therefore can prevent the generation of arcing discharge caused by the level difference, which makes it possible to reduce the generation of PARTICLES.

In the present invention, not only crystal orientation but also forming a recrystallized structure which is as fine as possible, that is, controlling an average crystal grain size to 20 μm or less are needed for reducing PARTICLES.

Mere fibrous structure obtained after cold working can meet an object only of enhancing the crystal orientation. However, since in this structure, large anisotropy is present in a cold working direction and cold working strain remains, uniform erosion in sputtering can not proceed, and a lot of PARTICLES are produced.

In contrast with this, conversion to a recrystallized structure reduces anisotropy in a cold working direction and releases large cold working strain, which results in being capable of reducing PARTICLES.

Further, it is very important to control an average crystal grain size in a recrystallized structure to 20 μm or less, preferably 10 μm or less.

Heating to 500° C. or higher in order to obtain a recrystallized structure as was the case with conventional techniques has coarsened crystal grains and provided only crystal grains having an average grain size of 30 to 40 μm. This has been one of causes to increase PARTICLES. In contrast with this, since a cold working reduction ratio is enhanced to a large extent in the present invention, the synergetic effect thereof makes it possible to carry out recrystallization at low temperatures and provides a fine structure having an average crystal grain size of 20 μm or less. Accordingly, it is effective for preventing the generation of PARTICLES.

Since the titanium target of the present invention has fine crystal grains and shows strong orientation, it provides a very effective action that even if erosion caused by sputtering goes on, PARTICLES can be prevented from growing during the period of sputtering without increasing level difference caused by difference in the erosion rates of the respective crystal grain.

Large variance in the sizes of crystal grains is liable to produce as well a level difference by erosion, and therefore the less the variance in crystal grain size is, the better. In the present invention, variance in crystal grain size is uniformized preferably to 3 to 15 µm, more preferably 5 to 15 µm.

Further, since the titanium target of the present invention has strong crystal orientation and fine crystal grains as described above, there can be shortened time for presputtering (called no-load sputtering in some cases) carried out to remove working layers and oxide films on the surface of the target to obtain a stable sputtering plane so that a stable sputtered film can be obtained. The shorter the presputtering time is, the better from a production point of view. Since presputtering time is consumed for removing crystal grains which form working affected layers and oxide films on the surface of the target, more uniform crystal plane and finer crystal grains can provide a stable sputtering plane for shorter time and therefore shorten the presputtering time.

If twin and acicular structures formed when heating up to a "β" titanium region and cooling down are present in recrystallized grains, acicular irregularities are produced in the crystal grains present in an erosion part, which causes an increase in PARTICLES, and therefore the proportion of the crystal grains in which the acicular structure is formed is controlled preferably to 20% or less, more preferably 5% or less in terms of an area ratio.

As described above, in the production method of the resent invention, the cold working rate has been controlled to 75% or more.

In the present invention, the cold working rate of 75% or more has been provided in order to obtain a strong orientation to the (0002) planes even in a fine recrystallized structure.

Such the high cold working reduction ratio as described above allows recrystallization to start at low temperatures and can provide a very fine recrystallized structure. Further, recrystallization at low temperatures provides as well the effect of controlling the formation of an acicular structure which is one of causes for PARTICLES.

In the resent invention, heat treatment temperatures for recrystallization are 300° to 480° C., preferably 350° to 450° C.

This is because it has been confirmed that at the working reduction ratio of 75% or more, crystal grains are coarsened at temperatures exceeding 480° C., and a lot of the acicular structures described above are produced.

Example 1

First, a titanium ingot of a 5N (purity: 99.999%) grade was subjected to forced rolling at a cold rolling reduction ratio of 78% in terms of integration after hot forging.

A change in the structure in each of the production steps was observed with an optical microscope after etching the structure of the titanium ingot and the structures thereof after hot forging and cold rolling with a hot nitric acid solution. The results thereof are shown in FIGS. 5a and 5b to FIGS. 7a and 7b.

As shown in FIGS. 5a and 5b to FIGS. 7a and 7b, definite grain boundaries were not confirmed in the structures in the steps of ingot to rolling.

Next, the materials obtained after cold rolling was subjected to a heat treatment at a temperature changed from 280° C. to 580° C. to obtain the targets of the invention and the comparative examples. Oxygen concentrations in all targets fell in a range of 400 to 500 ppm.

The structures of the targets obtained after heat treatment were observed after etching them in the manner described above.

Figure 1A:
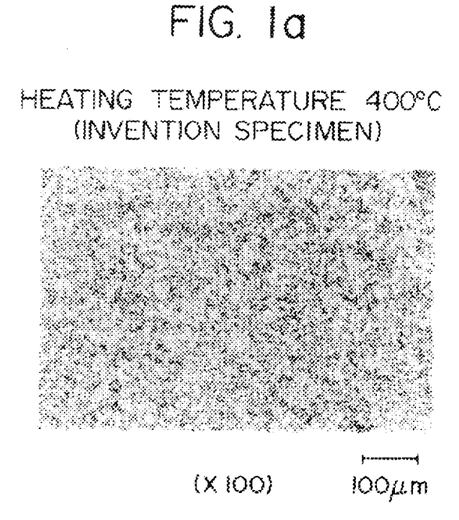
FIGS. 1a and 1b are photographs showing examples of a metal microstructure in the target of the present invention subjected to a heat treatment at 400° C.
Figure 1B:
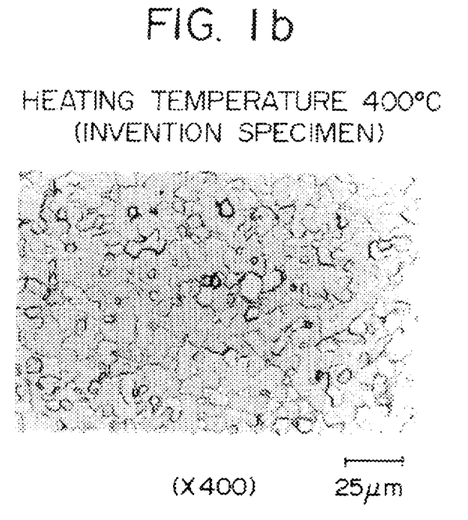

The typical structure of the present invention obtained after carrying out the heat treatment at 400° C. for 60 minutes is shown in FIGS. 1a and 1b.

As shown in FIGS. 1a and 1b, it can be found that the target structure of the present invention is a fine recrystallized structure and a rolled structure does not substantially remain therein.

Figure 2A:
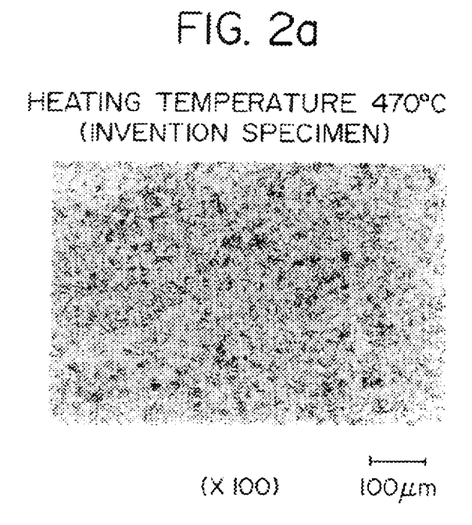
FIGS. 2a and 2b are photographs showing examples of a metal microstructure in the target of the present invention subjected to a heat treatment at 470° C.
Figure 2B:
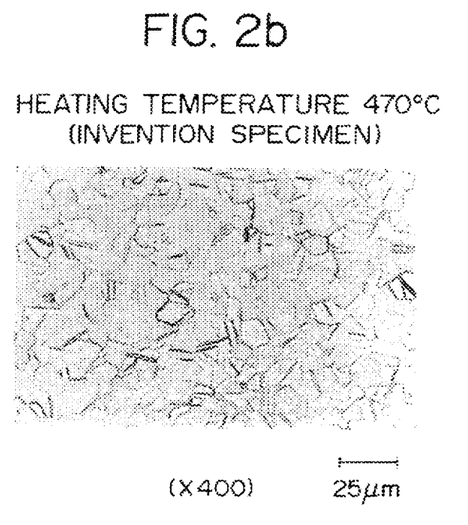

Shown in FIGS. 2a and 2b is the target structure of the present invention obtained in the same conditions as those in FIGS. 1a and 1b, except that the heat treatment temperature was elevated up to 470° C. As shown in FIGS. 2a and 2b, a small amount of crystal grains having an acicular structure appears in the crystal grains as the crystal grains grow, as compared with the target structure shown in FIGS. 1a and 1b.

Figure 3A:
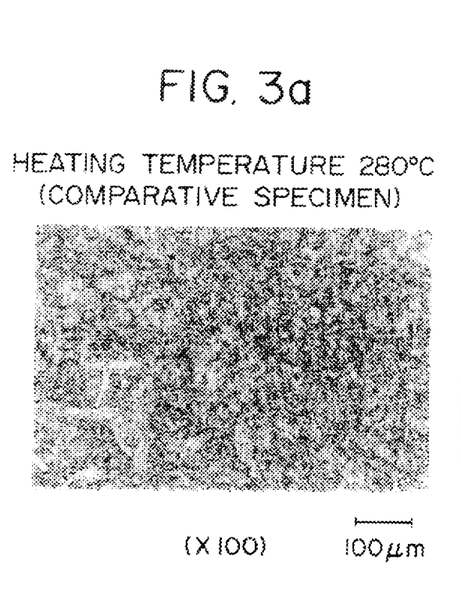
FIGS. 3a and 3b are photographs showing examples of a metal microstructure in the target of a comparative example subjected to a heat treatment at 280° C.
Figure 3B:
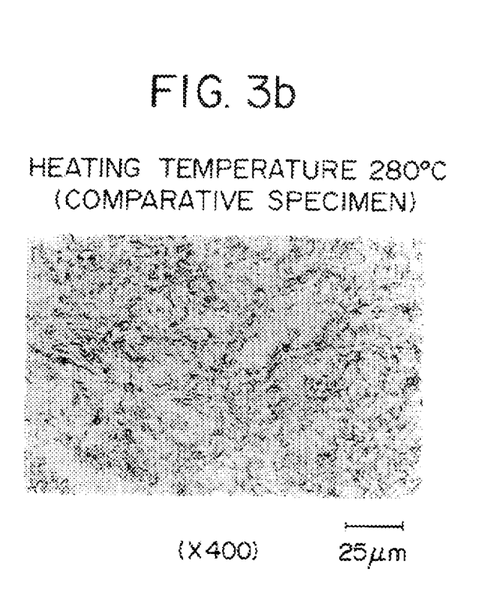

Shown in FIGS. 3a and 3b is the target structure of the comparative example obtained in the same conditions as those in FIGS. 1a and 1b, except that the heat treatment temperature was lowered down to 280° C. As shown in FIGS. 3a and 3b, fine grains are observed to be present, and it is confirmed that recrystallization starts. However, a great part thereof is occupied by a rolled structure.

Remaining of such rolled structure increases notably the generation of PARTICLES as will be shown by the data described later and therefore is not preferred.

Figure 4A:
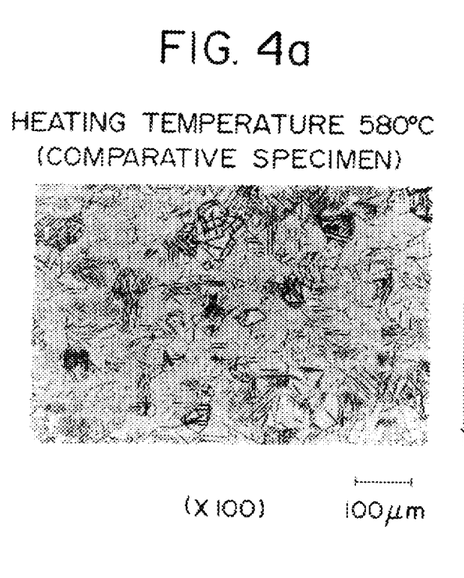
FIGS. 4a and 4b are photographs showing examples of a metal microstructure in the target of a comparative example subjected to a heat treatment at 580° C.
Figure 4B:
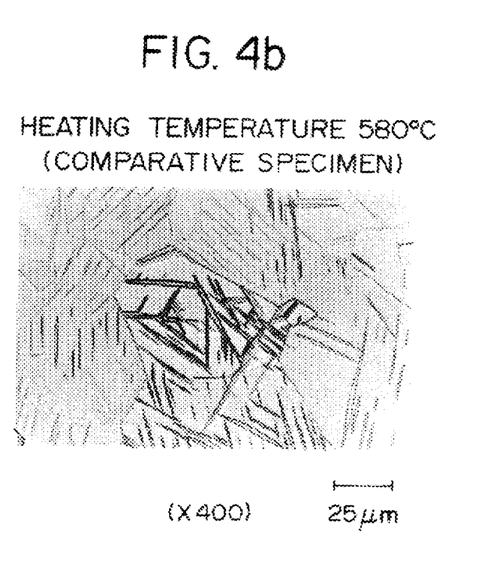
Figure 5A:
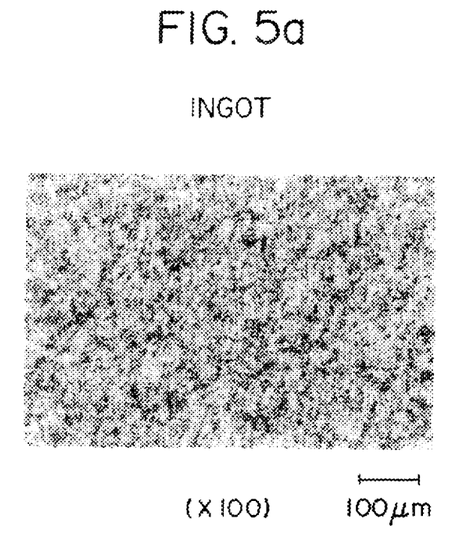
FIGS. 5a and 5b are photographs showing examples of a metal microstructure as cast (ingot).
Figure 5B:
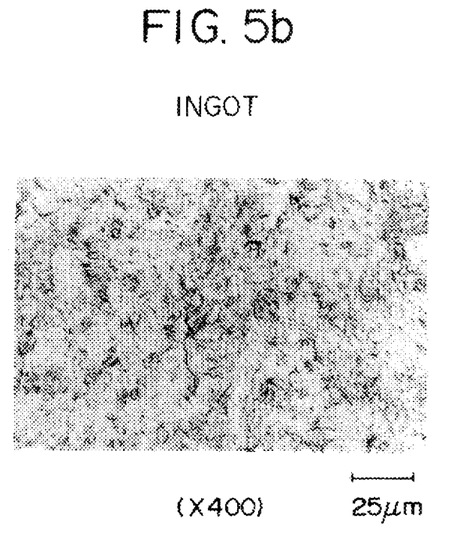
Figure 6A:
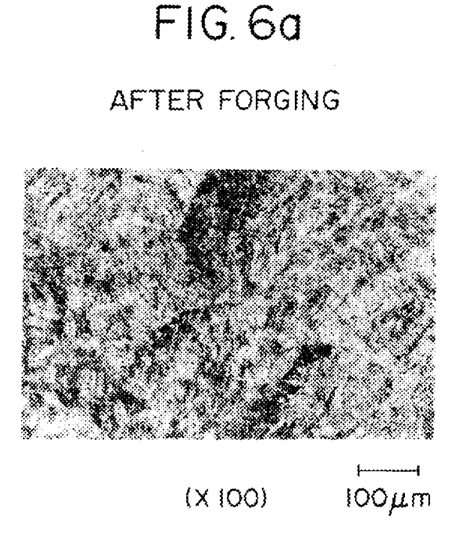
FIGS. 6a and 6b are photographs showing examples of a metal microstructure as forged.
Figure 6B:
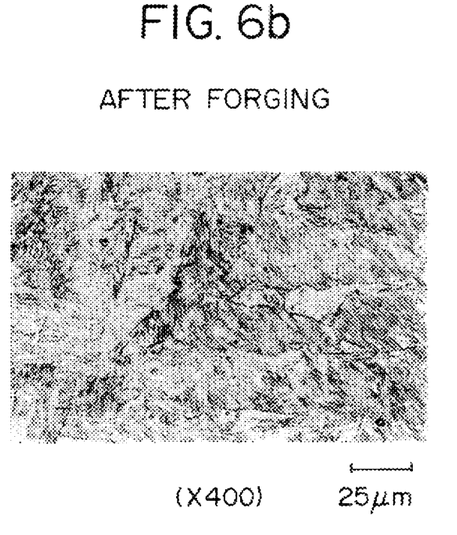
Figure 7A:
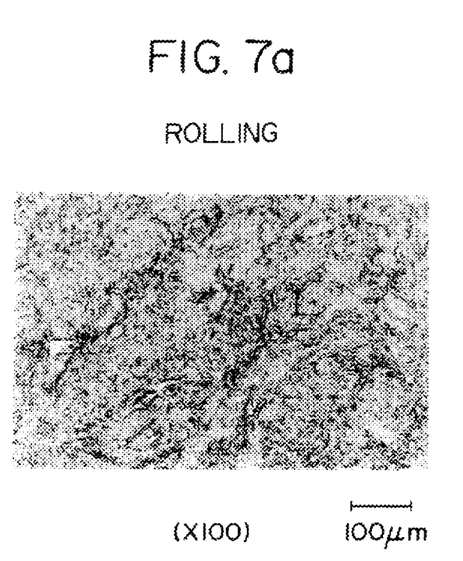
FIGS. 7a and 7b are photographs showing examples of a metal microstructure as rolled.
Figure 7B:
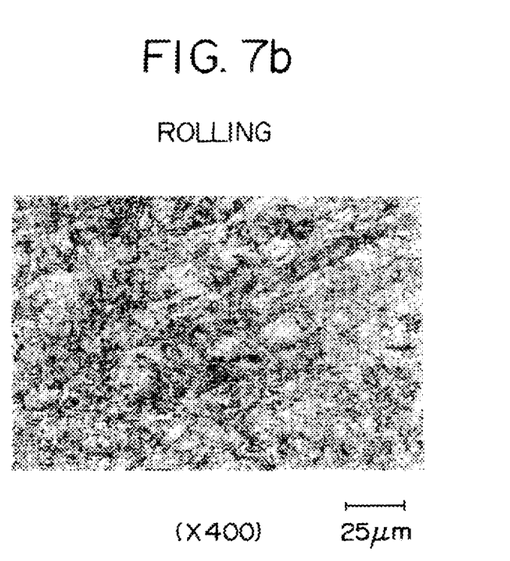

Shown in FIGS. 4a and 4b is the target structure of the comparative example obtained in the same conditions as those in FIGS. 1a and 1b, except that the heat treatment temperature was elevated up to 580° C. In the target shown in FIGS. 4a and 4b, the crystal grains are coarsened as compared with the targets of the present invention shown in FIGS. 1a and 1b and FIGS. 2a and 2b, and acicular structures are observed in almost all crystal grains.

The sputtering planes on the surfaces of the targets having the structures described above were measured with an X-ray diffraction to determine $(0002)/(10\bar{1}1)$ and $(0002)/(10\bar{1}0)$ which are intensity ratios of a (0002) plane to $(10\bar{1}1)$ and $(10\bar{1}0)$ planes.

A minimum crystal grain size Dmin, a maximum crystal grain size Dmax, and an average crystal grain size Dav were determined in terms of crystal grain size from a microstructure photography of 400 magnifications by an intercept method, and an area rate of crystal grains (acicular structure crystal grains) in which the acicular structures were observed was determined. The results thereof are shown in Table 1. The samples subjected to a heat treatment at 280° C. are not described since the rolled structures remained and the crystal grain size could not be determined.

TABLE 1

| No. | Heat treatment temp. °C | X-ray diffraction intensity ratio (0002)/(10$\bar{1}$1) | (0002)/(10$\bar{1}$0) | Crystal grain size (μm) Dmin | Dmax | Dav | Acicular structure crystal grain area (%) | Remark |
|---|---|---|---|---|---|---|---|---|
| 1 | 400 | 1.48 | 11.1 | 3 | 12 | 9 | 0 | Invention specimen |
| 2 | 470 | 1.18 | 8.3 | 5 | 13 | 11 | 8 | Invention specimen |
| 3 | 280 | 1.85 | 20.0 | — | — | — | — | Comparative specimen |
| 4 | 580 | 0.75 | 4.3 | 32 | 63 | 49 | 98 | Comparative specimen |

As shown in Table 1, it can be found that in Samples 1 and 2 of the present invention, the value of an X-ray diffraction intensity ratio (0002)/(10$\bar{1}$1) is 0.8 or more and the value of (0002)/(10$\bar{1}$0) is 6 or more and that the (0002) planes which are a closest packed plane are textured on a sputtering plane and a (10$\bar{1}$0) plane which is the most coarse plane is scarcely present. As shown in FIGS. 1a and 1b and FIGS. 2a and 2b described above, in the samples of the present invention, the fine recrystallized structures in which the rolled structures do not substantially remain are formed while they have structures in which the (0002) planes are strongly textured. It can be found that particularly in Sample 1 subjected to a heat treatment at 400° C., the crystal grain size is 10 μm or less in terms of an average crystal grain size and an acicular structure is not observed and that variance in the crystal grain size fall in a range of 5 to 15 am.

These targets were used to form titanium films by sputtering, and various evaluations were carried out. After evacuating a chamber to an achievable pressure of 4×10$^{-5}$ Pa, the titanium films were formed on silicon wafers having a diameter of 4 inches in a film thickness of 300 nm in the conditions of a substrate temperature of 250° C., a pressure of 0.13 Pa using argon for sputtering gas, and a sputtering power density of 12 W/cm$^2$, and the number of resulting PARTICLES having a size of 0.2 μm or more was determined.

The titanium films were formed in the same conditions as those described above on the silicon wafers on which pseudo contact holes having an aperture of 1 μm had been formed with silicon oxide. Then, the substrates were broken, and the cross sections thereof were observed under an electron microscope to determine the film thicknesses of the titanium films formed on the bottom faces and side faces of the contact holes. A ratio B/S was determined, wherein B represents the film thickness on the bottom face of the contact hole, and S represents the film thickness on the side face thereof. The larger value of B/S means more sputtering grains which reach the bottom face of the contact hole. The results thereof are shown in Table 2.

TABLE 2

| No. | Particle number/wafer | Bottom film thickness/side face film thickness B/S | Remark |
|---|---|---|---|
| 1 | 24 | 1.67 | Invention specimen |
| 2 | 32 | 1.52 | Invention specimen |
| 3 | 153 | 1.72 | Comparative specimen |
| 4 | 77 | 1.20 | Comparative specimen |

As shown in Table 2, in Sample 3 of comparison in which resulting PARTICLES remained in the rolled structure, while the bottom titanium film thickness could be thickened, the PARTICLES were produced in markedly large quantities, and therefore the sample was not preferred. On the other hand, in Sample 4 of comparison in which the heat treating temperature was raised higher than the conditions applied to the samples of the present invention, the aggregation degree of the (0002) planes were lowered, and the crystal grains were coarsened. A structure having an acicular structure in the crystal grains grew up to increase the generation of the PARTICLES very much, and therefore the sample was not referred.

In contrast with the comparative examples described above, in Samples 1 and 2 of the present invention, recrystallization in which a rolled structure did not substantially remain at a very high cold-working rate of 78% and 480° C. or lower made it possible to cause the (0002) planes which were a closest packed plane to be textured on a sputtering plane and reduce the (10$\bar{1}$0) plane which was the most coarse plane. Further, the fine crystal grains could be obtained. It can be found that this made it possible to achieve a control in the generation of PARTICLES and an increase in the thickness of a titanium film on the bottom face of the contact holes at the same time.

Example 2

After a titanium ingot of 5N (purity: 99.999%) was subjected to hot forging, the cold rolling reduction was changed to 50 to 85% as shown in Table 3 to subject the ingot to cold rolling, and then the heat treating temperature was controlled to subject the ingot to a heat treatment for 60 minutes so that a recrystallized structure was obtained as shown in Table 3.

A sputtering plane on the surface of the target having such structure as described above was measured with X-ray diffraction in the same manner as that in Example 1 to determine (0002)/(10$\bar{1}$1) and (0002)/(10$\bar{1}$0) which are the intensity ratios of (0002), (10$\bar{1}$1) and (10$\bar{1}$0) planes.

Further, a minimum crystal grain size Dmin, a maximum crystal grain size Dmax, an average crystal grain size Dav, and an area percentage of acicular structure crystal grains were determined in terms of crystal grain size from a microstructure photography of 400 magnifications by an intercept method. The results thereof are shown in Table 3. Further, sputtering was carried out in the same manner as that in Example 1 to evaluate the generation of PARTICLES and the film thicknesses of titanium on the bottom face and side face of a contact hole. Sample 5 is the same as Sample 1 shown in Example 1. The oxygen concentrations in all targets fell in a range of 400 to 500 ppm.

TABLE 3

| No. | Rolling rate % | Heat treatment temperature °C. | X-ray diffraction intensity ratio (0002)/(10$\bar{1}$1) | (0002)/(10$\bar{1}$0) | Crystal grain size (μm) Dmin | Dmax | Dav | Acicular structure crystal grain area (%) | Remark |
|---|---|---|---|---|---|---|---|---|---|
| 5 | 78 | 400 | 1.48 | 11.1 | 3 | 12 | 9 | 0 | Invention specimen |
| 6 | 85 | 375 | 1.54 | 11.6 | 3 | 11 | 8 | 0 | Invention specimen |
| 7 | 50 | 520 | 0.76 | 4.8 | 15 | 300 | 180 | 30 | Comparative specimen |
| 8 | 70 | 500 | 0.98 | 5.4 | 7 | 30 | 12 | 12 | Comparative specimen |

TABLE 4

| No. | Particle number/wafer | Bottom film thickness/side face film thickness B/S | Remark |
|---|---|---|---|
| 5 | 24 | 1.67 | Invention specimen |
| 6 | 25 | 1.69 | Invention specimen |
| 7 | 58 | 1.24 | Comparative specimen |
| 8 | 33 | 1.30 | Comparative specimen |

As shown in Table 3, it can be found that since in Samples 7 and 8 of comparison, the rolling rates were low, and the heating temperatures at which a recrystallized structure was obtained was high, the crystal grain size was large, and the proportion of an acicular structure was high and that the degree of texture at the (0002) planes which were closest packed plane was lowered as compared with those of Samples 5 and 6 of the present invention, and that of a (10 $\bar{1}$0) plane which was the most coarse plane was high.

It has been confirmed that sputtering with such targets of comparison as described above increases the generation of PARTICLES as compared with the targets of the present invention as shown in Table 4 and that the titanium film thickness on the bottom face is thinned and therefore such targets are not preferred.

In order to confirm the cause of the generation of PARTICLES, the roughness on the sputtering planes of the target sample 5 of the present invention and the target sample 7 of comparison obtained after the sputtering described above were measured with a surface roughness meter. The results thereof are shown in FIG. 8 and FIG. 9 in terms of diagrams of roughness measured with the roughness meter.

Figure 8:
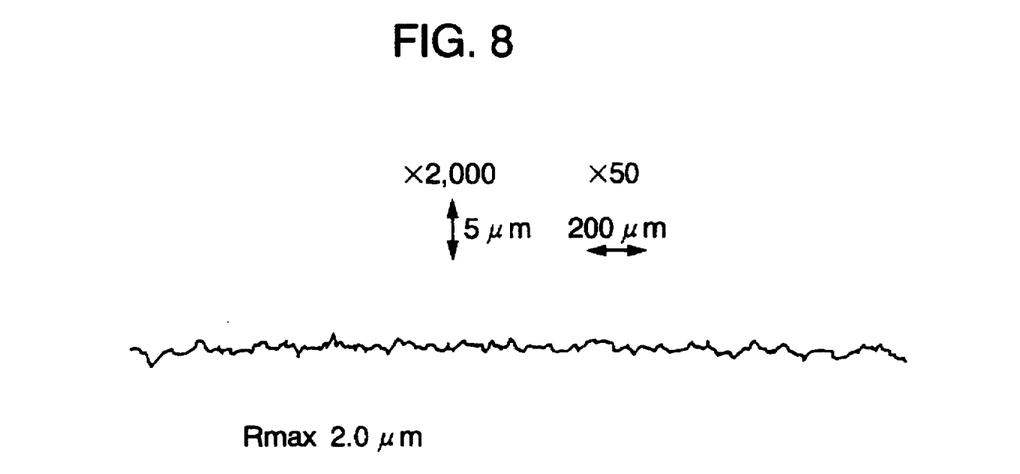
FIG. 8 is a drawing showing one example of roughness on a sputtering plane after sputtering the target of the present invention.
Figure 9:
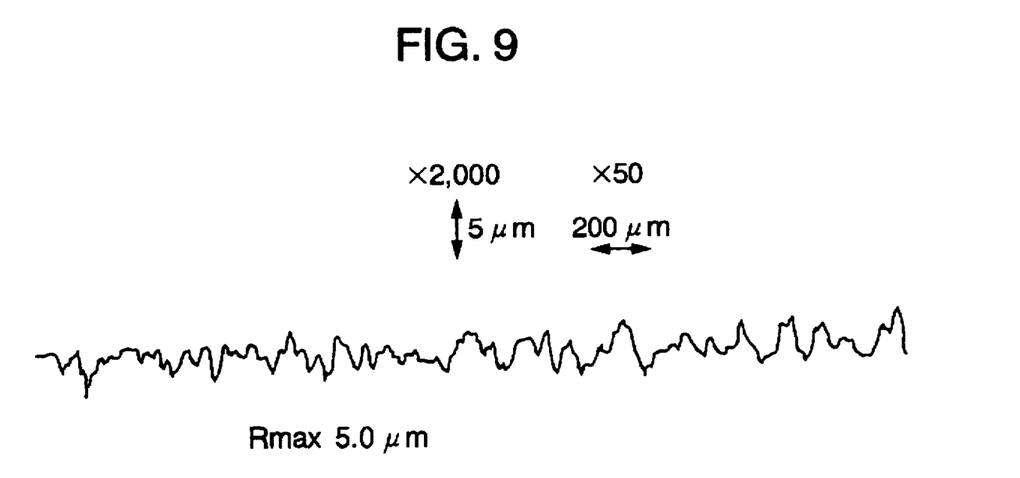
FIG. 9 is a drawing showing one example of roughness on a sputtering plane after sputtering the target of a comparative example.

As apparent from the comparison of FIG. 8 showing the roughness on the sputtering plane of the target of the present invention with FIG. 9 showing the roughness of the target of the comparison, even if the structures thereof have almost the same recrystallized grains, the targets of the present invention in which crystal directions are aligned increase in the roughness less than the targets of the comparison.

This shows that in the targets of the present invention, difference between sputtering rates of the respective crystal grains contained in the structures is not increased even by a progress in sputtering. Accordingly, it can be found that the targets of the resent invention have the effect that they can prevent PARTICLES from increasing even at the latter period of sputtering as compared with the targets of the comparison.

Example 3

The target sample 5 of the present invention and the target sample 7 of the comparison each obtained in Example 2 were used to apply them to reactive sputtering for forming titanium nitride films.

After evacuating a chamber to an achievable pressure of $4\times10^{-5}$ Pa, the titanium nitride films were formed on silicon wafers having a diameter of 4 inches in a film thickness of 300 nm in the conditions of a substrate temperature of 250° C., a pressure of 0.26 Pa using a mixed gas (ratio 50:50) of pure argon and nitrogen for sputtering gas, and a sputtering power density of 15 W/cm$^2$ to determine the number of resulting PARTICLES having a diameter of 0.2 μm or more on the thin films.

Further, the film thicknesses of titanium on the bottom face and the side face of a contact hole were evaluated in the same manner as that in Example 2. A ratio B/S was determined, wherein B represents the film thickness on the bottom face of the contact hole, and S represents the film thickness on the side face thereof. The larger the value of B/S is, the more sputtering grains reach the bottom face of the contact hole.

Further, a surface roughness Rmax of the target after sputtering was measured and evaluated. The results thereof are shown in Table 5, wherein the result obtained with the target sample 5 of the present invention was assigned to Sample 9, and the result obtained with the target sample 7 of the comparison was assigned to Sample 10.

TABLE 5

| No. | Particle number/wafer | Bottom film thickness/side face film thickness B/S | Rmax μm | |
|---|---|---|---|---|
| 9 | 152 | 1.32 | 2.5 | Invention specimen |
| 10 | 326 | 1.08 | 15.2 | Comparative specimen |

As shown in Table 5, it can be found that in the target of the present invention, less PARTICLES are produced and a titanium film thickness on the bottom face can be increased as compared with that of the target of the comparison as was the case with Example 2 also when reactive sputtering was carried out with the target of the present invention.

Further, it can be found that when the target of the present invention was used, a face roughness on the sputtering plane is small.

Accordingly, the effect has been confirmed that also in the reactive sputtering, crystals are aligned to a specified direction, and a fine recrystallized structure is formed, whereby difference between sputtering rates of the respective crystal grains contained in the structures is not increased even by a progress in sputtering, and PARTICLES can be prevented from increasing even at the latter period of the reactive sputtering.

According to the target of the present invention, it is easy to form a film in a hole of small in diameter and relatively deep in forming a titanium film by conventional sputtering and a titanium nitride film by reactive sputtering, and the formation of PARTICLES can be reduced not only at the initial period of sputtering but also at the latter period thereof.

Further, since the target of the present invention has a uniform plane and fine crystal grains, a stable sputtering plane comes out in a short time. This can shorten sputtering time.

Accordingly, there can be provided the target which can meet semiconductor parts having precise structures in recent years and which is effective for obtaining a thin film constituting a part thereof.

What is claimed is:

1. A titanium target for sputtering, wherein X-ray diffraction intensity ratios on a sputtering plane of the target are $(0002)/(10\bar{1}1) \geq 0.8$ and $(0002)/(10\bar{1}0) \geq 6$, and having a recrystallized structure having an average crystal grain size of 20 μm or less.

2. A titanium target according to claim 1, wherein an oxygen concentration is 600 ppm or less.

3. A titanium target according to claim 1, wherein the crystal grain size of the recrystallized structure falls in a range of 3 to 15 μm.

4. A titanium target according to claim 3, wherein an oxygen concentration is 600 ppm or less.

5. A titanium target for sputtering, wherein crystal orientations on a sputtering plane of the target by X-ray diffraction are $(0002)/(10\bar{1}1) \geq 0.8$ and $(0002)/(10\bar{1}0) \geq 6$ in terms of an X-ray diffraction intensity ratio; a recrystallized structure of the target has an average crystal grain size of 20 μm or less; and the proportion of crystal grains in which an acicular structure is present is 20% or less in terms of an area ratio.

6. A titanium target according to claim 5, wherein an oxygen concentration is 600 ppm or less.

7. A titanium target according to claim 5, wherein the crystal grain size of the recrystallized structure falls in a range of 3 to 15 μm.

8. A titanium target according to claim 7, wherein an oxygen concentration is 600 ppm or less.

9. A method for producing the titanium target for sputtering as claimed in claim 1, comprising:

subjecting a plate titanium material to cold working at a working rate of 75% or more in terms of integration, and then heating the titanium material at temperatures of 300° to 480° C. to orient the X-ray diffraction intensity ratios on a sputtering plane of the target to $(0002)/(10\bar{1}1) \geq 0.8$ and $(0002)/(10\bar{1}0) \geq 6$, wherein a recrystallized structure having an average crystal grain size of 20 μm or less is formed.

* * * * *